United States Patent
Siciliano et al.

(10) Patent No.: US 7,816,815 B2
(45) Date of Patent: Oct. 19, 2010

(54) SYSTEM AND METHOD FOR THE DETECTION OF REGENERATED AC VOLTAGE

(75) Inventors: Robert Siciliano, Boonton, NJ (US); James M. Daley, Easton, PA (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 309 days.

(21) Appl. No.: 11/529,183

(22) Filed: Sep. 28, 2006

(65) Prior Publication Data

US 2008/0082216 A1 Apr. 3, 2008

(51) Int. Cl.
*H01H 47/00* (2006.01)
(52) U.S. Cl. ...................................................... 307/126
(58) Field of Classification Search ............... 307/87, 307/64, 86, 126, 125, 127; 700/293, 292; 361/84, 76, 72, 85; 702/58
See application file for complete search history.

(56) References Cited

U.S. PATENT DOCUMENTS

| | | | | |
|---|---|---|---|---|
| 2,486,305 | A * | 10/1949 | Mahnke | 307/64 |
| 4,060,843 | A * | 11/1977 | Bost | 361/76 |
| 4,231,029 | A | 10/1980 | Johnston | |
| 5,967,106 | A * | 10/1999 | Schulze et al. | 123/179.3 |
| 6,465,912 | B1 * | 10/2002 | Nakamura et al. | 307/72 |
| 6,727,603 | B1 * | 4/2004 | McConnell et al. | 307/64 |
| 7,259,477 | B2 * | 8/2007 | Klikic et al. | 307/65 |
| 7,427,815 | B1 * | 9/2008 | Ye et al. | 307/127 |
| 2006/0006742 | A1 * | 1/2006 | Galm | 307/87 |

FOREIGN PATENT DOCUMENTS

EP 0771059 5/1997

OTHER PUBLICATIONS

International Search Report issued in related application PCT/US2007/079957, Feb. 13, 2008, pp. 1-4.
He, C. et al., "Static Transfer Switch (STS) model in EMTPWorks RV", Electrical and Computer Engineering, May 2, 2004, 1:111-116.

(Continued)

*Primary Examiner*—Jared J Fureman
*Assistant Examiner*—Daniel Cavallari
(74) *Attorney, Agent, or Firm*—McDonnell Boehnen Hulbert & Berghoff LLP

(57) ABSTRACT

A system and method are presented to detect and account for regenerated voltage in a three phase power source failures. The method involves monitoring a power source for phase voltage unbalances to determine the presence of a single phase failure. If the voltage unbalance caused by the single phase failure is restored before a sensing timer expires, a regenerated voltage condition is detected and retransfer to the power source is inhibited. Retransfer to the power source may be delayed by a period determined by a retransfer time value, in order to prevent transfer cycling between the preferred power source and an alternate power source. In addition, retransfer inhibiting may be terminated due to user interaction, power source voltage readings indicating a repair state, or by failure of an alternate source.

4 Claims, 5 Drawing Sheets

OTHER PUBLICATIONS

Hornak D.L. et al., "Automated Bus Transfer Control for Critical Industrial Processes", Proceedings of the Industrial & Commercial Power Systems Technical Conference, Apr. 30, 1990, pp. 5-22.

"Application Note: Dealing with Single Phase Loss on Wye-Wye Transformer Primary", ASCO Power Technologies, Florham Park, NJ, Oct. 2005, pp. 1-3.

ECN Web Page, Engineering Change and Release Notice for Controlled Documentation, https://info.ascoswitch.com/ECN/ecndisplay.asp, ASCO Power Technologies, Florham Park, NJ, Oct. 7, 2005, 2 pages.

* cited by examiner

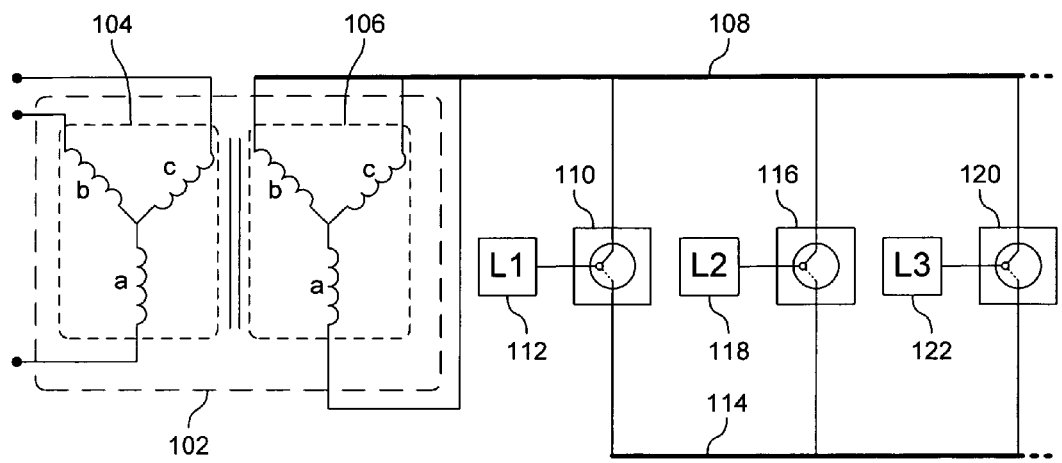
FIG. 1 (*prior art*)
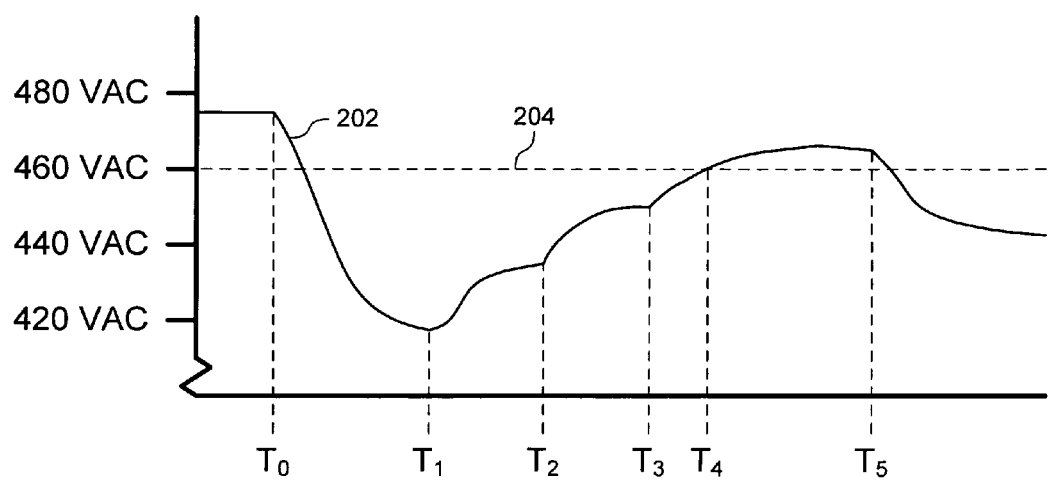
FIG. 2 (*prior art*)

SYSTEM AND METHOD FOR THE DETECTION OF REGENERATED AC VOLTAGE

BACKGROUND

1. Field of the Invention

The present invention relates generally to the field of power switching systems. More specifically, the present invention relates to controllers for electric power schemes, such as those utilizing transfer schemes and automatic power transfer switches.

2. Description of the Related Art

Three-phase transformers are ubiquitous in power transmission and distribution systems. They typically consist of one or more magnetic cores with primary and secondary coil windings. Their purpose in the electrical system is to change, or transform, the voltage amplitude from one value to another. In general, the incoming side is referred to as the transformer primary whereas the outgoing side is referred to as the secondary. There are many permutations of transformer construction and winding for a multitude of applications.

Where power continuity is vital, various types of establishments have a backup power source to account for situations in which the preferred power source is unavailable. In these configurations control systems typically are designed for unattended monitoring and decision making to ensure electrical loads are automatically powered from the best available source. For example, if the preferred source fails, an automatic power switching system is generally responsible to activate the alternate source and transfer the load in an appropriate manner. Once the preferred source becomes restored, the automatic power switching system can autonomously coordinate retransfer.

Typically, the preferred source is provided by a utility company that delivers power through a transformer that converts transmission (or sub-transmission) and distribution voltage levels to utilization levels. The alternate, or backup, source is typically a standby generator which does not require a transformer because its output voltage is already at the utilization level.

FIG. 1 is an illustration of power system deployment showing a series of automatic transfer switches 110, 116, 120 for selectively coupling loads to preferred and alternate power sources. The preferred source includes a three-phase transformer 102 having a primary winding 104 and secondary winding 106. The secondary winding 106 feeds a preferred power source bus 108, which feeds the automatic transfer switches 110, 116, and 120. These automatic transfer switches 110, 116, and 120 selectively couple their respective loads 112, 118, and 122, to either the preferred source bus 108 or the alternate power source via an alternate power source bus 114.

Many power outages in three phase systems are preceded by single-phase faults whereby only one phase is lost on the transformer primary side. Some power outages are limited to single-phase faults entirely, for example, where a fallen tree takes down only one power phase. It has been both observed and reported that a single-phase fault on the primary side of certain installations containing a transformer having a grounded Wye-Wye configuration can lead to erratic behavior in automatic power switching equipment. In such a configuration, the load transfer controller generally detects the single-phase fault as an undervoltage or voltage unbalance condition, or combination thereof. The controller subsequently initiates transfer to the alternate source and awaits restoration of the preferred source. As a result, the transformer becomes unloaded. Through the effects of magnetic flux linkage and core magnetization, the secondary phase corresponding to the failed primary phase can develop a regenerated voltage, which may give the appearance that the source has been restored to validity. For similar reasons, voltage may be regenerated on the primary side as well. In a regenerated voltage condition, the co-existence of two properly energized phases, a fully magnetized core structure, and magnetic flux linkage to the de-energized phase windings induces the regenerated voltage with an appropriate phase angle relationship to the two good phases. The loading on this regenerated voltage phase, including transformer impedance, directly influences the magnitude of the regenerated voltage. Therefore, as impedance loading decreases, the regenerated voltage magnitude converges towards nominal terminal voltage.

In the worst-case scenario, the regenerated voltage rises to a level deemed acceptable to the parameter settings of the load transfer controller. FIG. 2 is a graph illustrating a single phase voltage reading of a three phase system 202 exhibiting a phase voltage failure and a regenerated voltage condition. The single phase voltage failure occurs at time $T_0$, and is followed by a drop in single phase voltage reading to below the minimum phase voltage threshold 204 of the system as specified in the load transfer controller. Consequently, a retransfer sequence commences. Times $T_1$, $T_2$ and $T_3$ indicate unloading of the preferred source by automatic transfer switches. Following this unloading, the energized phases (not shown) cause a regenerated voltage in the failed single phase 202 which bring the single phase voltage reading 202 above the phase voltage threshold 204 at time $T_4$. After this time, an automatic transfer switch may erroneously determine that the preferred voltage source has been restored and therefore initiate retransfer. When loads retransfer back to the preferred source transformer at time $T_5$, the resultant loading once again exposes an undervoltage or voltage unbalance condition leading to another transfer back to the alternate source. In such a scenario conditions exist for an indefinite cycling of this behavior until the preferred source becomes truly restored or repaired. Such continual cycling impedes continuity of electric power and is detrimental to the operation of critical loads. A method and system are needed to accurately detect this condition and cause the transfer scheme to react accordingly.

SUMMARY

In general, a system and method for switching a load between a preferred power source and alternate power source are presented. In one aspect, the system comprises a power switch that switches the load between the preferred power source and the alternate power source; phase voltage sensors that measures phase voltages of the preferred power source; a memory that stores and outputs a sense time value and a voltage unbalance threshold value; and a processor that receives the phase voltages and memory output. The processor also determines the voltage unbalance of the preferred source, and outputs a switch control to the power switch. When the voltage unbalance of the three phase system exceeds the voltage unbalance threshold value, the processor reacts by directing the power switch to disconnect from the preferred power source, or unload the preferred power source, while determining whether a regenerated voltage condition exists. If a regenerated voltage condition exists, the processor acts to inhibit the power switch from retransferring to the preferred power source.

The system may also comprise a voltage sensing timer that expires upon counting to a sense time value. Determining whether a regenerated voltage condition exists may involve initiating the voltage sensing timer upon unloading the preferred power source, monitoring the voltage unbalance, and determining that the regenerated voltage condition exists if the voltage unbalance of the three phase system falls below the voltage unbalance threshold before the voltage sensing timer expires.

Also, where a voltage unbalance condition is detected, the processor may direct the power switch to connect to an alternate power source. The voltage sensing timer may be a component or function of the processor.

The system may also comprise a retransfer delay timer that expires upon counting to a retransfer delay value, in which case the memory may also store and output a retransfer delay value. In such a configuration, inhibiting the power switch may include initiating a retransfer delay timer, and directing the power switch to remain disconnected from the preferred power source until after the retransfer delay timer has expired.

Additionally, the retransfer delay timer may be a component or function of the processor. Also, the retransfer delay timer may be forced to expire by several other system events, such as a failure of an alternate source, an indication that the preferred source has been taken down for repairs, or by user interaction via, for example, a manual override device.

In another embodiment, the system for transferring a load between a preferred power source and an alternate power source may comprise a power switch for switching the load between the preferred power source and the alternate power source, a voltage unbalance monitor that measures the phase voltages of the preferred power source and outputs a voltage unbalance condition if the voltage unbalance exceeds a voltage unbalance threshold, a voltage sensing timer that expires upon counting to a sense time value, and control logic that communicates with the voltage sensing timer and receives the voltage unbalance condition signal from the voltage unbalance monitor. In addition, the control logic outputs a switch control to the power switch. Where a voltage unbalance condition exists, the control logic reacts by directing the power switch to disconnect from the preferred power source and initiating the voltage sensing timer. In addition, the control logic inhibits the power switch from retransferring to the preferred power source if the voltage unbalance falls below the voltage unbalance threshold value before the voltage sensing timer expires.

The system may also include a retransfer delay timer that expires upon counting to a retransfer delay value. In such a configuration, inhibiting the power switch from retransferring back to the preferred power source may comprise initiating the retransfer delay timer, and directing the power switch to remain disconnected from the preferred power source until after the retransfer delay timer has expired.

In yet another embodiment, a method for accounting for regenerated voltage in a power system includes monitoring phase voltages of a preferred power source for a voltage unbalance, unloading the preferred power source when it has a voltage unbalance that exceeds a voltage unbalance threshold, determining whether a regenerated voltage condition exists in the failed phase, and inhibiting the power switch from retransferring to the preferred power source if a regenerated voltage condition exists in the failed phase. The method may also include transferring to an alternate power source after unloading the preferred power source.

In addition, determining whether a regenerated voltage condition exists in the failed phase may include initiating a voltage sensing timer upon unloading the preferred power source, where the voltage sensing timer expires upon counting to a voltage sensing time delay value; and determining that a regenerated voltage condition exists if the voltage unbalance of the three phase system falls below the voltage unbalance threshold value before the voltage sensing timer expires. Inhibiting the power switch from retransferring to the preferred power source may include initiating a retransfer delay timer, where the retransfer delay timer expires upon counting to a retransfer delay value; and directing the power switch to remain disconnected from the preferred power source until after the retransfer delay timer has expired.

Additionally, the delay timer may be forced to expire if the phase voltages of the alternate power source indicate a failure of the alternate power source, if a user override switch or manual override switch is activated, or if the a complete failure of the preferred power source occurs.

These and other aspects and advantages of the invention will become apparent to those of ordinary skill in the art in view of the following detailed description, with reference to the accompanying figures where appropriate. Further, it is understood that this summary is merely an example and is not intended to limit the scope of the invention as claimed.

BRIEF DESCRIPTION OF THE DRAWINGS

Exemplary embodiments of the invention are described below in conjunction with the appended figures, wherein like reference numerals refer to like elements in the various figures, and wherein:

FIG. 1 is a block diagram showing a series of automatic transfer switches for selectively coupling loads to preferred and alternate power sources, according to the prior art;

FIG. 2 is a graph illustrating a single phase voltage of a three phase system exhibiting a phase voltage failure and a regenerated voltage condition, according to the prior art;

DETAILED DESCRIPTION

A system and method for switching a load between a preferred and alternate power source are described. Among other benefits, the system and method detect regenerated voltages that may signal the presence of a single-phasing condition in a poly-phase source. In addition, the system and method help to avoid load cycling between preferred and alternate poly-phase power sources during single-phasing conditions, where there is a preferred power source single-phase failure exhibiting regenerated voltage when unloaded. The system and method may avoid cycling by inhibiting the retransfer to the preferred power source when single-phasing conditions are present.

Figure 3:
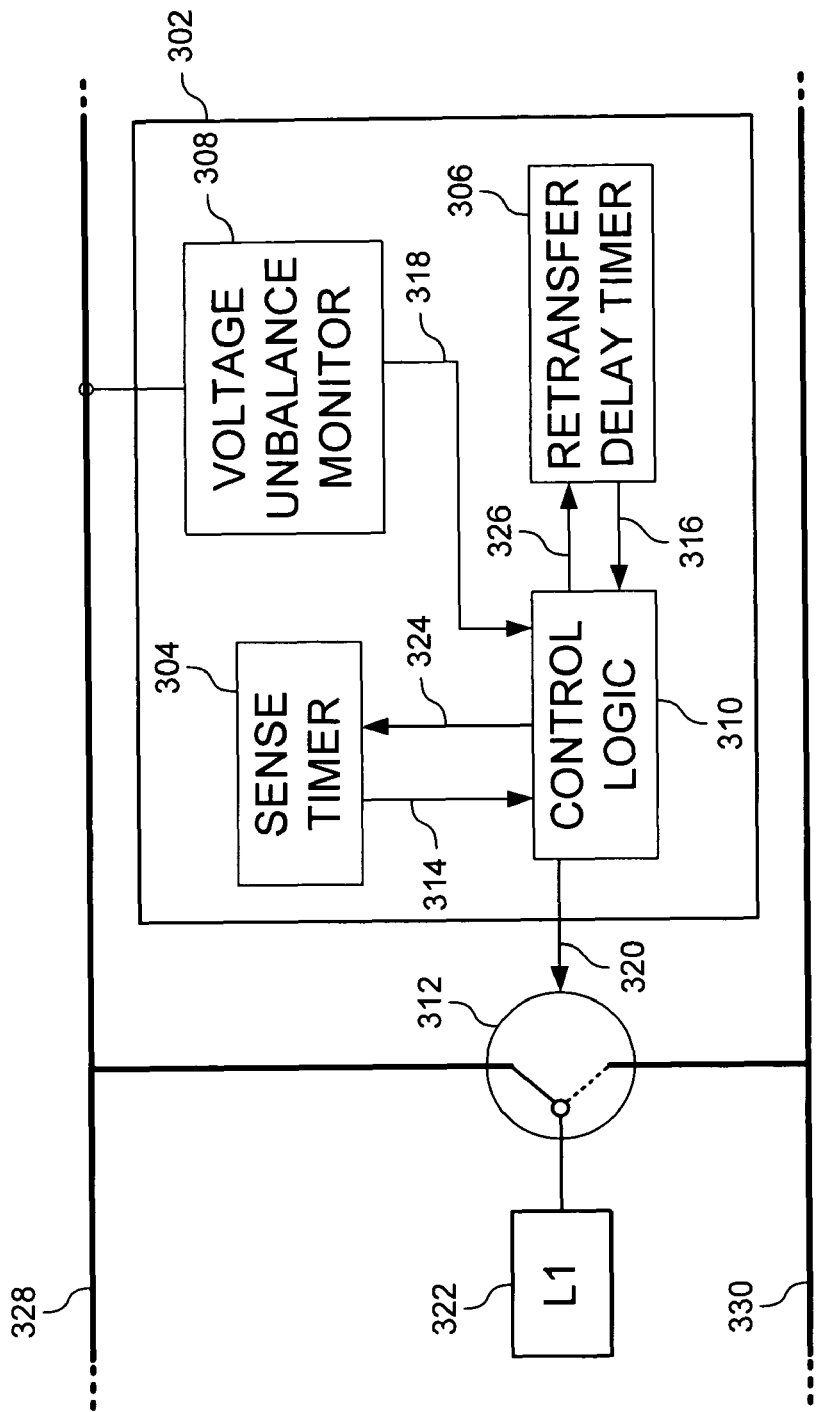
FIG. 3 is a simplified schematic showing a power switching system, according to another embodiment.

FIG. 3 is a simplified schematic showing a power switching system, according to one embodiment. The power switching system permits a load 322 to be powered by either a preferred power source or an alternate power source (or possibly no source in some embodiments). Generally, the preferred power source may be provided by a power utility, although any type of multi-phase power source may serve as the preferred source. In addition, the alternate power source may be a backup generator, although any type of multi-phase power source may serve as the alternate power source. In one configuration, the preferred source may be a three-phase transformer, and similarly the alternate power source may be a three-phase power system. Specifically, the preferred source may be a grounded Wye-Wye transformer, with the power switching system selectively coupled to the transformer secondary.

In general, the power switching system comprises a controller 302 and a power transfer switch 312. The transfer switch 312 selectively couples the load 322 to either a preferred poly-phase power source via a preferred source bus 328, or an alternate poly-phase-power source via an alternate source bus 330. The transfer switch 312 may be one of any type of power transfer switches including, but not limited to, open transfer switches, delayed transfer switches, and closed transfer switches. The technology comprising the transfer switch 312 may be include electromechanical contactors, solid state devices, circuit breaker devices or other suitable device for electric power transfer. Accordingly, the transfer switch 312 may comprise a single operator to permit connection to either a first our second source; alternatively, the transfer switch 312 may comprise two operators to permit connecting the load to a first, second, or no source.

As shown in the embodiment of FIG. 3, the controller 302 may comprise a sense timer 304, a voltage unbalance monitor 308, and control logic 310. Additionally, the controller may comprise a delay timer 306, especially in systems where the control behavior upon detection of regenerated voltage involves a retransfer delay, as further explained below.

The voltage unbalance monitor 308 measures the voltage unbalance on the preferred source bus 328 using one or more generally known methods. The measured voltage unbalance may be the result of, for example, a phase voltage unbalance, a line voltage unbalance, or a calculation of voltage unbalance which utilizes a comparison between positive and negative sequence voltage components. Where the phase voltage unbalance is sought, the voltage unbalance may be determined by measuring the phase voltages of the preferred source bus 328, determining the average of these phase voltages, and then dividing the variation of a phase voltage from this average by the average itself to yield the final voltage unbalance for the given phase voltage. Alternatively, line voltages may be measured and manipulated in a similar manner to determine a similarly applicable voltage unbalance. In addition, other voltage unbalance calculation or approximation methods may be utilized by the voltage unbalance monitor 308 to determine voltage unbalances.

The voltage unbalance monitor 308 compares the measured voltage unbalance of each of the phases in the preferred source bus 328 to a voltage unbalance threshold. If a measured voltage unbalance is greater than the voltage unbalance threshold, the voltage unbalance monitor 308 may send an output signal 318 to the control logic 310 indicating the presence of a voltage unbalance condition along with the phase generating this condition.

Figure 4:
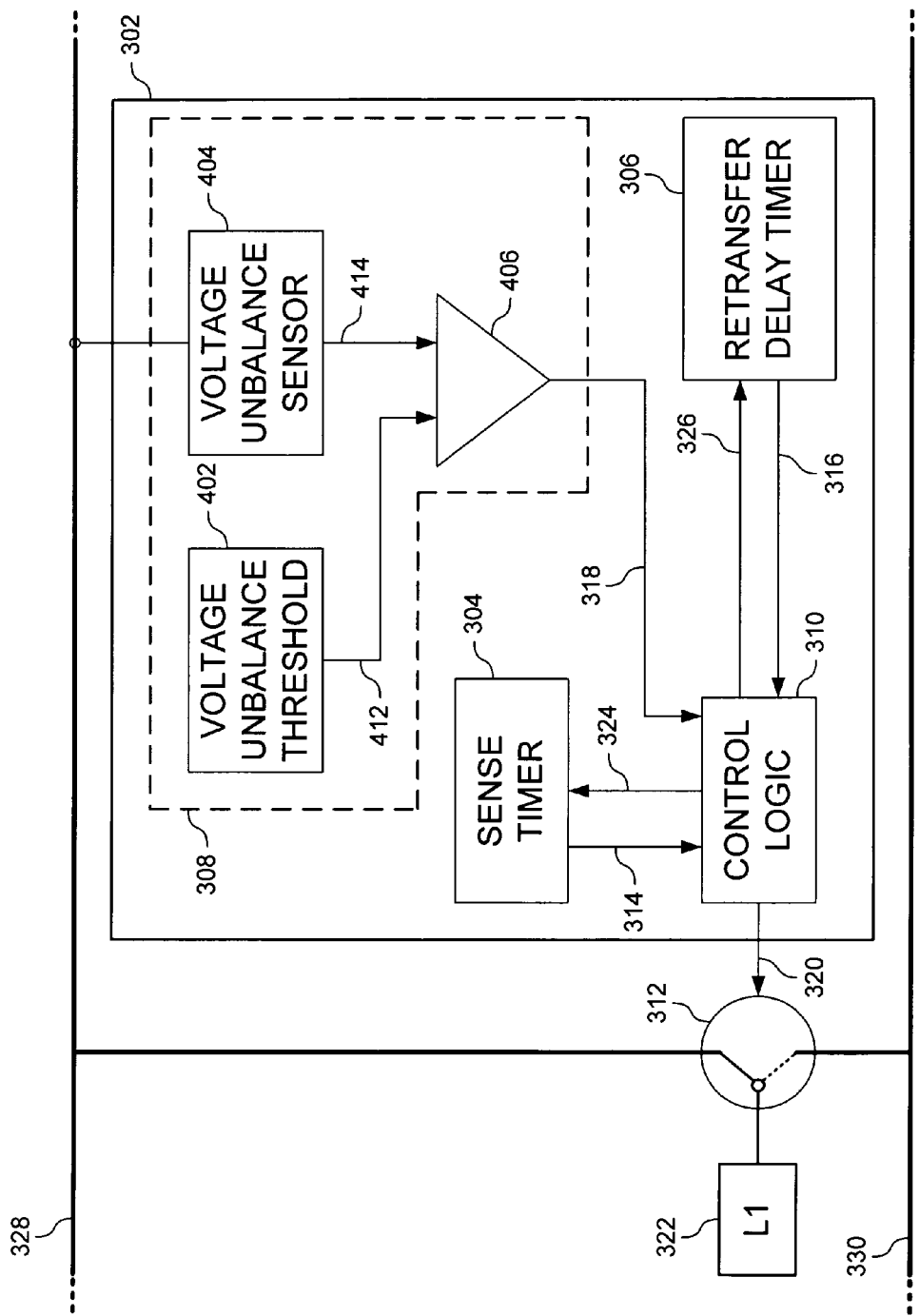
FIG. 4 is a detailed schematic showing a power switch system and several components of a voltage unbalance monitor, according to yet another embodiment.

FIG. 4 is a detailed schematic showing a power switch system and several components of the voltage unbalance monitor 308. As shown, the voltage unbalance monitor 308 includes a voltage unbalance sensor 404, a voltage unbalance threshold storage 402, and a comparator 406. The voltage unbalance sensor 404 determines the voltage unbalance of each of the phases on the preferred power source bus 328, and outputs these readings to the comparator 406 via a signal 414. The comparator 406 compares the voltage unbalances of each of the phases to the voltage unbalance threshold stored in the voltage unbalance threshold storage 402 via signal 412.

The voltage unbalance threshold may be user-defined, and may be selected in order to vary the sensitivity of the voltage unbalance monitor 308, and therefore the sensitivity of the controller 302 itself. The voltage unbalance threshold may be selected based on the characteristics of the preferred power supply, alternate power supply, load 322, or a combination of the characteristics of these components. In general, a lower voltage unbalance threshold may be selected for a load 322 that is more sensitive; conversely a higher voltage unbalance threshold may be selected for a load 322 that is more robust. As a practical consideration, the voltage unbalance threshold should be selected such that it discriminates against typical variations in the terminal voltage of the preferred power source.

Generally, the response of the control logic 310 to a voltage unbalance condition will depend on the current state of the power switch 312. A voltage unbalance condition on one of the phases of the preferred source bus 328 will generally indicate a phase outage or a preferred source failure in its entirety. Therefore, when the power switch 312 is engaged in coupling the preferred power source to the load 322, a voltage unbalance condition may indicate that the preferred power source has become unable to provide adequate power to the load 322. As a result, the control logic 310 may respond to a voltage unbalance condition by directing the power switch 312 via signal 320 to disconnect from the preferred power source by disengaging from the preferred power source bus 328.

Where the voltage unbalance condition is caused by a single phase failure (such as a complete loss of voltage or a drop in voltage), the controller 302 may detect for regenerated voltage on the phase experiencing the failure. In one embodiment of the system, the controller 302 may check for regenerated voltage as a default setting. However, a user may also be able to enable or disable regenerated voltage detection. If regenerated voltage detection is enabled, upon unloading the load 322 from the preferred source, the control logic 310 may communicate with the sense timer 304 via a signal 324, and initiate the sense timer 304.

Upon initiation, the sense timer 304 is reset and begins to count a period of time equal to a sense delay value, after which the sense timer 304 expires. The sense delay value is the amount of time that the control logic 310 waits before sampling the voltage unbalance of the preferred power source; therefore the control logic 310 will wait to sample the voltage unbalance until the sense timer 304 has expired. Whether a voltage unbalance condition exists on a previously failed phase at the expiration of the sense timer 304 may be used by the control logic 310 to determine the presence of regenerated voltage: if a voltage unbalance exists at the expiration of the sense timer 304, the control logic 310 may determine that regenerated voltage is not detected and may proceed with a normal operating sequence retransfer to the preferred power system as soon as the preferred power system is determined to be within desired parameters; however, if the voltage unbalance condition has cleared before the sense timer 304 has expired, the control logic 310 will conclude that regenerated voltage is likely present in the previously failed phase and will execute a pre-determined control behavior upon regenerated voltage detection, as further described below.

The sense delay value may range from a number of seconds to a period of hours, and may depend on a variety of factors, including the characteristics of the preferred power supply or the load 322, or some combination of the characteristics of these components. In general, the sense delay value of the sense timer 304 should be set to a value that is greater than the minimum amount of time needed for regenerated voltage to become detectable. In other words, the sense delay value should be greater than the amount of time required for the preferred system to become unloaded or nearly unloaded. As a practical consideration, in a configuration in which multiple loads are connected to the preferred source, the sense delay value should be greater than the minimum amount of time needed for the power transfer switches servicing these loads to decouple from the preferred source. In addition, when determining an effective sense delay value for a system, the specifics of the preferred power supply may be considered. For example, when the preferred power supply comprises a three-phase grounded Wye-Wye transformer, the sense delay value may provide for the amount of time required for magnetic flux linkage in the windings of the failed phase to fully induce a regenerated voltage at the terminal.

Where the controller 302 and power switch 312 compose an automatic transfer switch and a voltage unbalance condition is detected, the power switch 312 will normally begin a transition to the alternate source. Depending on the type of transition (i.e. open, delayed, closed), the switch to an alternate source may proceed immediately, or after a certain amount of delay. However, because the sense timer 304 is initiated immediately upon unloading from the preferred power source, the enabled regenerated voltage detection is independent of the type of switch transition.

Once the power switch 312 has disconnected the load from the preferred power source 328, the control logic 310 receives information on the status of the preferred power source through the voltage unbalance monitor 308 in accordance with the regenerated voltage detection scheme described above. If the control logic 310 determines that a regenerated voltage condition is present on the preferred power source bus 328, the control logic 310 will execute a regenerated voltage detection control behavior that will inhibit retransfer to the preferred source. Inhibiting retransfer may be accomplished by preventing transfer to the preferred source until a manual override command is given, or by delaying transfer to the preferred source. Alternatively, a user may be able to select the manner in which retransfer to the preferred source is inhibited.

Where inhibiting retransfer occurs through a delay in transfer to the preferred source, the controller 302 may comprise a retransfer delay timer 306. In order to track the amount of delay desired in preventing retransfer to the preferred source, the control logic 310 will initiate the retransfer delay timer 306 via a signal 326, and will await an indication that the retransfer delay timer 306 has expired via a signal 316. Depending on the manner of delay sought (if indeed a delay is sought or required), the retransfer delay timer 306 may be initiated upon unloading from the preferred source, upon connecting to the alternate source, or upon the detection of regenerated voltage. In configurations where the delay sought is based upon the life expectancy of the alternate source, the retransfer delay timer 306 may be initiated upon connecting to the alternate source. In other configurations, initiating the retransfer delay timer 306 at another period of time may be more beneficial.

Upon initiation, the retransfer delay timer 306 is reset and begins to count a period of time equal to a retransfer delay value, after which the retransfer delay timer 306 will expire. The retransfer delay value is the amount of time that the control logic 310 will wait before attempting to retransfer to the preferred power source; therefore the control logic 310 will inhibit retransfer to the preferred source until the retransfer delay timer 306 has expired.

The retransfer delay value may range from a number of seconds to a substantial period of hours, and may depend on a variety of factors, including the characteristics of the preferred power supply, alternate power supply, load 322, or some combination of the characteristics of these components. In one embodiment, the retransfer delay value of the retransfer delay timer 306 may be set at or near the maximum life of the alternate power supply. For example, if the alternate power supply can provide power to the load 322 for a maximum of 24 hours, the retransfer delay value may be set at or near this 24 hour maximum. In another embodiment, the retransfer delay value of the delay timer may be set at or near the expected worst-case time for a response to and correction of a preferred source failure. For example, if the preferred power supply is serviced by a utility source which has a worst-case response time to a service interruption of about 2 hours, the retransfer delay value may be set to a value that is equal to or slightly greater than 2 hours. Additionally, the retransfer delay value may be determined according to a combination of the above and in addition to other factors.

In other configurations, the degree to which retransfer to the preferred source is inhibited may be tempered by one or more limitations. For example, the controller 302 may have the ability to detect failures on the alternate source, either where an additional voltage unbalance monitor is present and is dedicated to the alternate source bus 330, or where the voltage unbalance monitor 308 also monitors the alternate source bus 330; if the alternate source fails, the controller 302 may clear the delay timer 306 and permit retransfer to the preferred source via typical retransfer logic (i.e. retransfer in the absence of regenerated voltage detection, which may include retransfer to the preferred source as soon as the preferred power source parameters are within acceptable tolerances). In another example, the voltage unbalance monitor 308 may monitor the preferred source bus 328 for a complete failure of all phases, which may be a precursor to repairs on the preferred source; upon a complete failure of all phases on the preferred source bus 328, the control logic 310 may also clear the delay timer 306 and permit retransfer via typical retransfer logic. Finally, as noted above, a user may intervene (via, for example, a manual override switch) and bypass the delay timer 306 and permit retransfer via typical retransfer logic. Forcing the timer to expire by other means has the effect of clearing the retransfer delay timer and effectuating a return to a default retransfer setting, in which the control permits retransfer to the preferred source after the preferred source attains voltage levels that are within acceptable tolerances.

Figure 5:
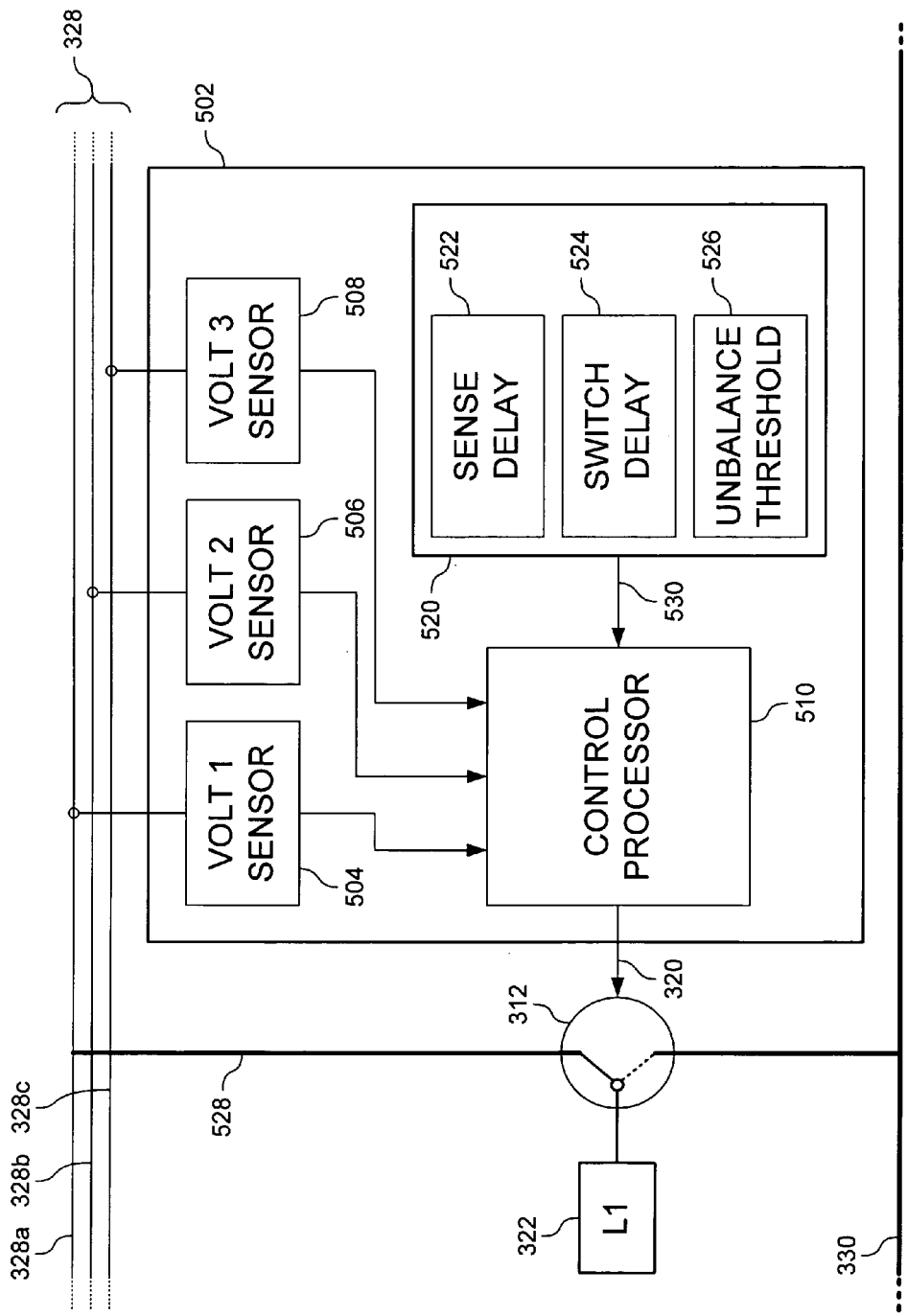
FIG. 5 is a detailed schematic showing a power switch system comprising a central control processor, according to yet another embodiment.

FIG. 5 is a detailed schematic showing a power switch system comprising a central control processor 510. The power switch system includes a power transfer switch 312 and a controller 502, where the controller 502 is based around a central control processor 510. In general, the behavior of the controller 502 is similar to that of controller 302, especially with respect to voltage unbalance conditions and inhibiting retransfer to the preferred power source when regenerated voltage is detected. However, in the controller 502, voltage unbalances are calculated by the central control processor 510, and any system parameter values (such as sense delay 522, unbalance threshold 526, and retransfer delay 524) are stored in a memory 520. In addition, the controller includes multiple voltage sensors 504, 506, 508.

The controller 502 includes a series of voltage sensors 504, 506, and 508 for measuring the voltage characteristics of each of the phases 328a, 328b, 328c on a preferred power source bus 328. Although a three-phase bus is illustrated, the controller 502 may be adapted to poly-phase power systems having additional phases by including additional voltage sensors. The voltage sensors 504, 506, and 508 may measure the phase voltage or line voltage of the phases on the preferred power bus, and may output these measured voltages to the control processor.

The control processor 510 receives the measured outputs from the voltage sensors 504, 506, and 508 and computes respective voltage unbalances for each of the phases 328a, 328b, 328c on the preferred power source bus 328. The control processor 510 then receives a voltage unbalance threshold value 526 stored in the memory 520. The voltage unbalance threshold value 526 may be determined in accordance with the discussion of voltage unbalance thresholds above. The control processor 510 compares the computed voltage unbalances with the voltage unbalance threshold value 526. If a computed voltage unbalance exceeds the voltage unbalance threshold value 526, the control processor 510 determines that a voltage unbalance condition exists on the corresponding phase.

When the power transfer switch 312 is connected to the preferred power source and a single phase failure is detected (i.e. when a phase has a voltage unbalance that exceeds the voltage unbalance threshold value), the control processor directs the switch 312 via switch control signal 320 to disconnect from the preferred power source. If regenerated voltage detection is enabled, the control processor 510 either initiates an external sense delay timer, or begins an internal sense delay timer that expires upon reaching the sense delay value 522 stored in the memory 520. The control processor 510 continues to measure the voltage unbalances of the preferred source phases after the sense delay timer has been initiated. Similar to the controller 302 above, if the voltage unbalance condition has cleared before the sense delay timer has expired, the control processor 510 determines that a regenerated voltage condition may exist and inhibits retransfer to the preferred source. On the contrary, if the voltage unbalance condition has not cleared and the sense delay timer expires, the control processor 510 determines that a regenerated voltage condition is not present and proceeds with typical retransfer logic.

When retransfer to the preferred power source is inhibited by a delay period, the control processor 510 either initiates an external retransfer delay timer, or begins an internal retransfer delay timer that expires upon reaching the retransfer delay value 522 stored in the memory 520. Therefore, upon detection of regenerated voltage, the control processor 510 inhibits retransfer to the preferred source for the amount of time specified by the retransfer delay value 524. As noted above, in certain embodiments, inhibiting retransfer to the preferred power source may be canceled by detection of preferred source repairs (as exhibited by, for example, voltage failure on all), by a user bypass command (as issued by, for example, activation of a manual override device), by an alternate power source failure, or by any combination of these and other relevant factors. After the retransfer delay timer expires, or if the retransfer delay is canceled, the control processor 510 proceeds with typical retransfer logic, as described above.

Figure 6:
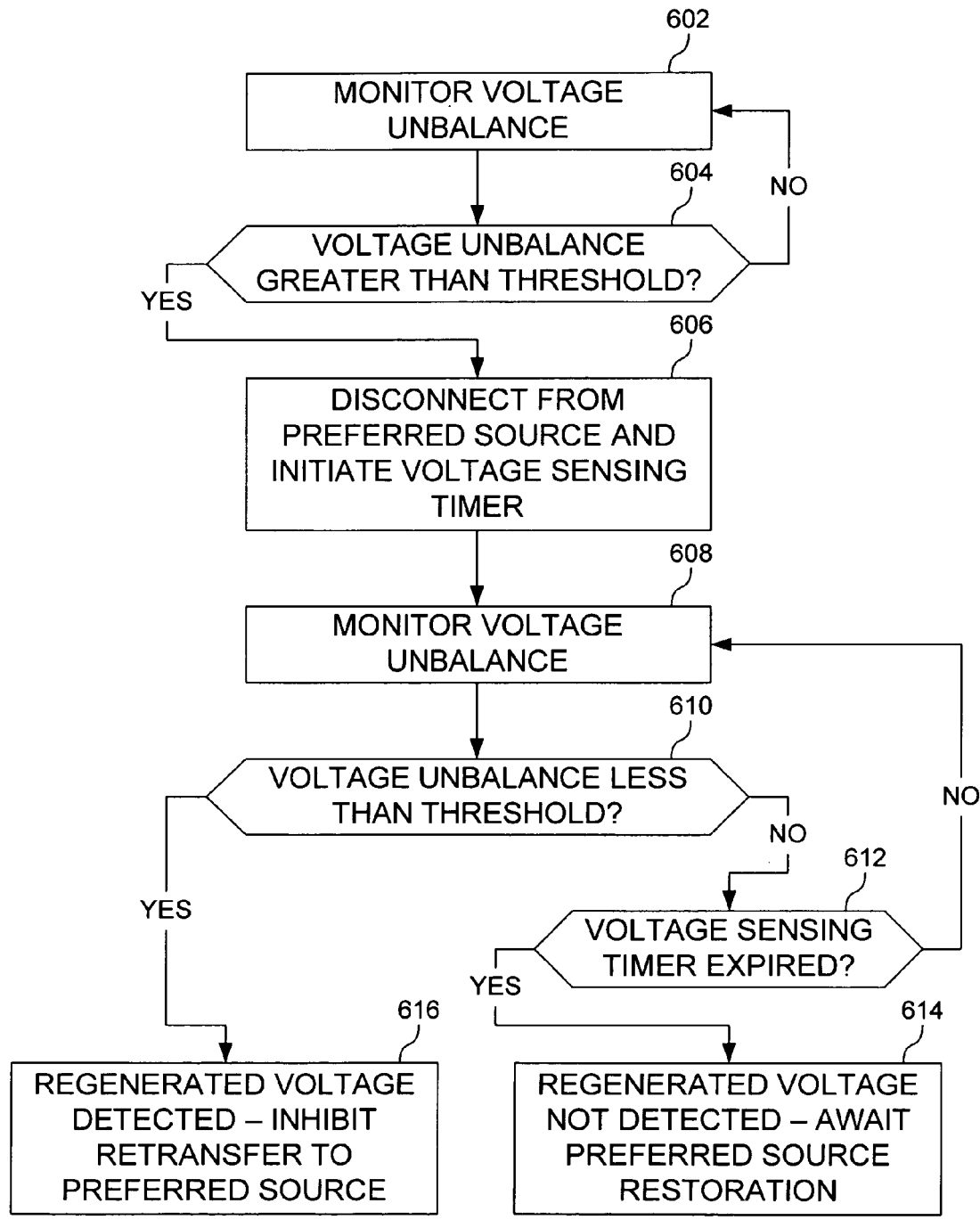
FIG. 6 is a flow diagram showing the operational steps of a power transfer switch controller, according to one embodiment.

FIG. 6 is a flow diagram showing the operational steps of a power transfer controller to detect and account for regenerated voltage in a power source failure (when such a feature is enabled). As an initial condition, it is assumed that the power switch is connected to a preferred power source, and that the preferred power source is operating within performance parameters. In this initial state, and at 602, the power transfer switch controller monitors the phases of the power source and determines the voltage unbalance of each phase.

The controller compares these voltage unbalances to a voltage unbalance threshold value at 604. If none of the voltage unbalances associated with the phases of the preferred voltage source exceed the voltage unbalance threshold value, then the controller continues monitoring the voltage unbalances of the preferred power source. However, if a voltage unbalance exceeds the voltage unbalance threshold value, the system proceeds to 606 and disconnects from the preferred power source. Upon disconnecting from the preferred power source, the controller also initiates a voltage sensing timer. When initiated, this voltage sensing timer begins counting a period of time that expires upon reaching the sense delay value.

After the sensing timer has been initiated, the controller continues to monitor the voltage unbalance at 608 in the same manner as in 602. The controller enters a sensing loop 610 where it continually monitors this voltage unbalance and compares it to the voltage unbalance threshold. While the voltage unbalance of the failed phase is above the voltage unbalance threshold and the voltage sensing timer has not expired, the controller remains in the sensing loop 612. If the voltage sensing timer expires before the voltage unbalance condition of the failed phase has been cleared, the controller determines that regenerated voltage is not present on the phase, and the system proceeds with typical retransfer logic at 614.

However, if the voltage unbalance condition of the failed phase is cleared before the voltage sensing timer has expired, the controller determines that regenerated voltage exists on the failed phase and proceeds to inhibit retransfer to the preferred source at 616. As noted above, the controller may inhibit transfer to the preferred source either by preventing transfer back to the preferred source until a user intercedes and forces retransfer, or by delaying retransfer to the preferred source until a transfer delay timer has expired.

In the latter case in which transfer is delayed, the controller initiates a retransfer delay timer which expires when it reaches a transfer delay value. In general, the controller remains in a loop of maintaining the retransfer delay timer and prevents retransfer to the preferred source until the retransfer delay timer has expired. Once the timer has expired, the controller may permit retransfer to the preferred power source using typical retransfer logic. In other embodiments, this delayed transfer loop may be interrupted by several events, such as failure of an alternate power source, issuance of a user bypass command, or an indication that the preferred source has been fully restored. Breaking the delay transfer loop via one of the above methods may result in the controller defaulting to typical retransfer logic.

It should be understood that the illustrated embodiments are examples only and should not be construed as limiting the scope of the present invention. Although the above examples are presented with respect to preferred and alternate power sources, aspects of the invention may be utilized as a transfer switch system and controller between any two power sources, such as preferred and alternate poly-phase power systems. Also, the drawings are illustrative and meant to support the detailed description; as such the present invention is not limited to the embodiments presented in the drawings. Moreover, the drawings are not to scale, and connections between various components are not limited to those shown in the drawings, as other components and connections may exist. Finally, since many modifications, variations, and changes in detail can be made to the described embodiments, it is intended that all matters in the foregoing description and shown in the accompanying drawings be interpreted as illustrative and not in a limiting sense, and it is intended to be understood that the following claims including all equivalents define the scope of the invention.

We claim:

1. A system for transferring a load between a preferred power source and an alternate power source, the system comprising:
a power scheme for switching the load between the preferred power source and the alternate power source;
a plurality of phase voltage sensors for measuring and outputting phase voltages of the preferred power source;
a memory for storing and outputting a sense time value and a voltage unbalance threshold value;
a preferred power source voltage sensing timer that expires upon counting to the sense time value;
a processor that receives the phase voltages and the memory output, determines a voltage unbalance from the phase voltages, and outputs a switch control to the power scheme, such that if the voltage unbalance exceeds the voltage unbalance threshold value, the processor reacts by:
directing the power scheme to disconnect the load from the preferred power source;
determining whether a regenerated voltage condition exists; and
inhibiting the power scheme from retransferring the load to the preferred power source if the regenerated voltage condition exists
further comprising a retransfer delay timer that expires upon counting to a retransfer delay value, wherein the memory further stores and outputs a retransfer delay value, and wherein inhibiting the power scheme from retransferring back to the preferred power source comprises:
initiating a retransfer delay timer; and
directing the power scheme to remain disconnected from the preferred power source until after the retransfer delay timer has expired, and
further comprising a second plurality of phase voltage sensors for measuring and outputting phase voltages of the alternate power source, wherein if the voltage unbalance exceeds the voltage unbalance threshold value, the processor further reacts by directing the power scheme to connect to the alternate power source, and wherein the retransfer delay timer expires if the second plurality of phase voltage sensors indicates a failure of the alternate power source.

2. A system for transferring a load between a preferred power source and an alternate power source, the system comprising:
a power scheme for switching the load between the preferred power source and the alternate power source;
a plurality of phase voltage sensors for measuring and outputting phase voltages of the preferred power source;
a memory for storing and outputting a sense time value and a voltage unbalance threshold value;
a preferred power source voltage sensing timer that expires upon counting to the sense time value;
a processor that receives the phase voltages and the memory output, determines a voltage unbalance from the phase voltages, and outputs a switch control to the power scheme, such that if the voltage unbalance exceeds the voltage unbalance threshold value, the processor reacts by:
directing the power scheme to disconnect the load from the preferred power source;
determining whether a regenerated voltage condition exists; and
inhibiting the power scheme from retransferring the load to the preferred power source if the regenerated voltage condition exists
further comprising a retransfer delay timer that expires upon counting to a retransfer delay value, wherein the memory further stores and outputs a retransfer delay value, and wherein inhibiting the power scheme from retransferring back to the preferred power source comprises:
initiating a retransfer delay timer; and
directing the power scheme to remain disconnected from the preferred power source until after the retransfer delay timer has expired, and
further comprising a manual override switch for selecting the preferred power source or alternate power source, wherein the manual override switch forces the power scheme to connect to the selected power source, and wherein the retransfer delay timer expires if the manual override switch is used to select the preferred power source.

3. A method for accounting for regenerated voltage in a power system comprising a preferred power source and an alternate power source, the method comprising the steps of:
monitoring phase voltages of the preferred power source for a voltage unbalance;
unloading the preferred power source when a failed phase has a voltage unbalance that exceeds a voltage unbalance threshold;
determining whether a regenerated voltage condition exists in the failed phase;
inhibiting a power scheme from retransferring a load to the preferred power source if a regenerated voltage condition exists
wherein inhibiting the power scheme from retransferring to the preferred power source comprises:
initiating a retransfer delay timer, where the retransfer delay timer expires upon counting to a retransfer delay value;
directing the power scheme to maintain the load disconnected from the preferred power source until after the retransfer delay timer has expired and
transferring the load to an alternate power source after unloading the preferred power source;
monitoring the phase voltages of the alternate power source; and
causing the retransfer delay timer to expire if the phase voltages of the alternate power source indicate an alternate power source failure.

4. A method for accounting for regenerated voltage in a power system comprising a preferred power source and an alternate power source, the method comprising the steps of:
monitoring phase voltages of the preferred power source for a voltage unbalance;
unloading the preferred power source when a failed phase has a voltage unbalance that exceeds a voltage unbalance threshold;
determining whether a regenerated voltage condition exists in the failed phase;

inhibiting a power scheme from retransferring a load to the preferred power source if a regenerated voltage condition exists
wherein inhibiting the power scheme from retransferring to the preferred power source comprises:
initiating a retransfer delay timer, where the retransfer delay timer expires upon counting to a retransfer delay value;
directing the power scheme to maintain the load disconnected from the preferred power source until after the retransfer delay timer has expired
further comprising the step of causing the retransfer delay timer to expire if a user override switch is activated.

* * * * *